United States Patent
Umezawa et al.

(10) Patent No.: US 9,946,153 B2
(45) Date of Patent: Apr. 17, 2018

(54) MASK BLANK AND TRANSFER MASK

(71) Applicant: HOYA CORPORATION, Shinjuku-ku, Tokyo (JP)

(72) Inventors: Teiichiro Umezawa, Tokyo (JP); Masafumi Ishiyama, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 29 days.

(21) Appl. No.: 15/268,818

(22) Filed: Sep. 19, 2016

(65) Prior Publication Data

US 2017/0003583 A1 Jan. 5, 2017

Related U.S. Application Data

(62) Division of application No. 14/391,345, filed as application No. PCT/JP2013/063047 on May 9, 2013, now Pat. No. 9,470,971.

(30) Foreign Application Priority Data

May 16, 2012 (JP) ................................ 2012-112333

(51) Int. Cl.
| | | |
|---|---|---|
| *G03F 1/26* | (2012.01) | |
| *G03F 1/32* | (2012.01) | |
| *C23C 14/00* | (2006.01) | |
| *C23C 14/06* | (2006.01) | |
| *C23C 14/22* | (2006.01) | |

(52) U.S. Cl.
CPC ............ *G03F 1/32* (2013.01); *C23C 14/0036* (2013.01); *C23C 14/0676* (2013.01); *C23C 14/225* (2013.01); *G03F 1/26* (2013.01)

(58) Field of Classification Search
None
See application file for complete search history.

(56) References Cited

U.S. PATENT DOCUMENTS

| | | |
|---|---|---|
| 5,849,439 A | 12/1998 | Mitsui |
| 2002/0058186 A1 | 5/2002 | Nozawa et al. |
| 2002/0086220 A1 | 7/2002 | Nozawa et al. |

(Continued)

FOREIGN PATENT DOCUMENTS

| | | |
|---|---|---|
| JP | 8-137094 A | 5/1996 |
| JP | 11-258772 A | 9/1999 |

(Continued)

OTHER PUBLICATIONS

International Search Report of PCT/JP2013/063047, dated Aug. 6, 2013. [PCT/ISA/210].

(Continued)

*Primary Examiner* — Stephen Rosasco
(74) *Attorney, Agent, or Firm* — Sughrue Mion, PLLC

(57) ABSTRACT

Provided is a mask blank in which a thin film for transfer pattern formation is provided on a main surface of a transparent substrate. The thin film is made of a material containing a transition metal and silicon and further containing at least one of oxygen and nitrogen. The thin film has as its surface layer an oxide layer with an oxygen content higher than that of the thin film of a region other than the surface layer. The thin film is formed so that the thickness of its outer peripheral portion is greater than that of its central portion on the main surface side. The oxide layer is formed so that the thickness of its outer peripheral portion is greater than that of its central portion on the main surface side.

7 Claims, 3 Drawing Sheets

(56) References Cited

U.S. PATENT DOCUMENTS

| | | |
|---|---|---|
| 2003/0228528 A1 | 12/2003 | Mitsui et al. |
| 2004/0110072 A1 | 6/2004 | Mitsui et al. |
| 2005/0170263 A1 | 8/2005 | Mitsui et al. |

FOREIGN PATENT DOCUMENTS

| | | |
|---|---|---|
| JP | 2001-210604 A | 8/2001 |
| JP | 2002-90978 A | 3/2002 |
| JP | 2002-162726 A | 6/2002 |
| JP | 2006-276648 A | 10/2006 |
| JP | 2006-323236 A | 11/2006 |
| JP | 2008-257239 A | 10/2008 |
| JP | 2009-48121 A | 3/2009 |
| JP | 2009-231694 A | 10/2009 |

OTHER PUBLICATIONS

Communication dated Nov. 3, 2015 from the Intellectual Property Office of Singapore issued in corresponding application No. 11201406324P.

Communication dated Feb. 1, 2017 issued by the Japanese Patent Office in corresponding Japanese Application No. 2013-099897.

MASK BLANK AND TRANSFER MASK

CROSS REFERENCE TO RELATED APPLICATIONS

This is a Divisional of application Ser. No. 14/391,345 filed Oct. 8, 2014, claiming priority based on International Application No. PCT/JP2013/063047 filed May 9, 2013, claiming priority based on Japanese Patent Application No. 2012-112333, filed May 16, 2012, the contents of all of which are incorporated herein by reference in their entirety.

TECHNICAL FIELD

This invention relates to a mask blank, a transfer mask, methods of manufacturing them, and so on.

BACKGROUND ART

Conventionally, there has been widely known a mask blank comprising a halftone phase shift film (hereinafter referred to as a phase shift film) made of MoSiN, MoSiON, or the like. In the manufacture of such a mask blank, it is usual to form a phase shift film on a main surface of a transparent substrate using a single-wafer sputtering apparatus. In a normal single-wafer sputtering apparatus, a rotary stage on which a transparent substrate is to be placed is provided in the lower part of a film forming chamber and a target is disposed directly above the rotary stage. However, in the case where the normal single-wafer sputtering apparatus is used in the formation of the halftone phase shift film, there has been a problem that the thickness of the film on the outer peripheral side of the main surface of the transparent substrate tends to be relatively small compared to that on the center side thereof due to a shape of the main surface of the transparent substrate being rectangular. The phase shift film is required to simultaneously achieve a function of transmitting exposure light at a predetermined transmittance and a function of producing a predetermined phase difference between the exposure light transmitted therethrough and exposure light transmitted in air for a distance equal to the thickness of the phase shift film. If there is non-uniformity in the thickness distribution in the plane of the formed phase shift film, there is a possibility of the occurrence of variation in transmittance distribution in the plane or the occurrence of variation in phase difference distribution in the plane. When a phase shift film of a material containing oxygen or nitrogen is formed on a transparent substrate by DC sputtering using as a target material a material containing silicon such as MoSiN or MoSiON, since a nitride of silicon or an oxide of silicon has low conductivity, particles due to charge-up tend to be produced on a target surface. There is a possibility that these particles fall onto the transparent substrate located directly below the target surface and enter the phase shift film, thereby forming defects. That is, there is also a problem that the defect occurrence ratio increases.

In order to solve the unique problems that arise when such a rectangular mask blank film is formed by sputtering, use is made of a single-wafer sputtering apparatus disclosed in JP-A-2002-090978 (Patent Literature 1). In this sputtering apparatus, a target is disposed obliquely above a rotary stage, on which a transparent substrate is to be placed, so that both horizontal and vertical distances are ensured between the transparent substrate and the target (see FIG. 4). By forming a phase shift film on the transparent substrate using the sputtering apparatus of such a structure (sputtering apparatus of a so-called oblique-incidence sputtering type), it is possible to prevent the thickness of the film on the center side of the substrate from becoming relatively large and further to reduce defects due to charge-up of a target surface.

On the other hand, a thin film made of a material such as MoSiN or MoSiON tends to have a relatively large compressive stress. In the process of manufacturing a phase shift mask, a transfer pattern is formed by etching a phase shift film. When the phase shift film is partially removed in the formation of the transfer pattern, a region where the phase shift film is removed is released from the compressive stress so that the interval between patterns (space width) increases. In order to minimize this influence, the film stress of the phase shift film should be reduced. In view of this, for example, as disclosed in JP-A-2002-162726 (Parent Literature 2), a hear treatment is applied at a temperature of 400° C. or more to a glass substrate formed with a phase shift film, thereby reducing the compressive stress. With the use of a hot plate, it is difficult to carry out the heat treatment at the temperature of 400° C. or more. In terms of processing a plurality of films at a time, it is effective to use a vertical electric furnace disclosed in JP-A-2002-162726 (Patent Literature 2).

In JP-A-2001-210604 (Patent Literature 3), an optical heating apparatus using a light source in which a plurality of cylindrical incandescent lamps are disposed in a lattice pattern is proposed as an apparatus for heating a glass substrate, a semiconductor wafer, or the like. This optical heating apparatus is featured in that it can uniformly irradiate light onto a surface to be treated and thus can uniformly apply optical heating to the surface to be treated.

PRIOR ART LITERATURE

Patent Literature

Patent Literature 1: JP-A-2002-090978
Patent Literature 2: JP-A-2002-162726
Patent Literature 3: JP-A-2001-210604

SUMMARY OF THE INVENTION

Problem to be Solved by the Invention

In the case where a film forming apparatus that forms a film by DC sputtering is used, there arises a problem of charge-up if a low-conductivity material is used as a target. When a thin film made of a metal compound containing oxygen or nitrogen is formed, it is difficult to use as a target material the same material as that of the thin film. Therefore, among the elements constituting the thin film, oxygen or nitrogen in a gaseous state (this is called a reactive gas) is supplied into a film forming chamber. The inside of the film forming chamber during sputtering should be maintained in a low-pressure state. Therefore, oxygen or nitrogen is supplied through a supply port of the film forming chamber and forcibly discharged through a discharge port thereof so as to be constantly replaced at a low pressure. In order to sputter material elements from a target, a plasma of a rare gas such as argon is required around the target. Therefore, preferably, the reactive gas such as oxygen or nitrogen is caused to flow in a space relatively close to a transparent substrate. Also in terms of reducing the generation of particles from around the target, the reactive gas such as oxygen or nitrogen is preferably supplied laterally or from below. However, if such a reactive gas supplying method is employed, the reactive gas such as oxygen or nitrogen tends to be supplied more on the outer peripheral side of the transparent substrate than on the center side thereof. In the sputtering deposition of a phase shift film, sputtered particles (Mo and Si particles) emitted from a target (MoSi target) take in oxygen or nitrogen and are deposited in the form of a metal compound (MoSiN or MoSiON) on a surface of a transparent substrate so that the phase shift film is formed. Accordingly, the present inventors have found that the content of oxygen or nitrogen in the phase shift film tends to be higher on the outer peripheral side (outer peripheral portion), where oxygen or nitrogen is present in a relatively large amount, of the transparent substrate than on the center side (central portion) thereof.

The present inventors have found that as the content of oxygen or nitrogen in the phase shift film increases, the transmittance for exposure light tends to be higher and that this influence cannot be ignored particularly in a phase shift mask to which short-wavelength ArF excimer laser is applied as exposure light. As described above, the in-plane transmittance uniformity is important for the phase shift film. From the above, the present inventors have found that the thickness of the phase shift film should be made greater on its outer peripheral side (outer peripheral portion) than on its center side (central portion) in order to adjust the in-plane transmittance uniformity. Further, the present inventors have found that when use is made of a sputtering apparatus of the so-called oblique-incidence sputtering type wherein a reactive gas such as oxygen or nitrogen is supplied from the lateral side or the lower side of a transparent substrate and most of the reactive gas is caused to flow in a space relatively close to the transparent substrate, a phase shift film in which the in-plane transmittance uniformity is controlled in a predetermined allowable range can be obtained by adjusting the horizontal and vertical distances between the transparent substrate and a target to form the phase shift film so that the thickness on its outer peripheral side (outer peripheral portion) is greater than that on its center side (central portion).

As described above, since the formed phase shift film has a film stress, it is necessary to reduce the film stress by carrying out a heat treatment. The phase shift film subjected to the heat treatment changes in transmittance and phase difference compared to the phase shift film before the heat treatment. Therefore, the film composition of the phase shift film when it is formed by sputtering is adjusted so that the phase shift film after carrying out the heat treatment has a predetermined transmittance and a predetermined phase difference. Accordingly, it is preferable that a heat treatment using the vertical electric furnace be carried out under the same condition for all glass substrates which are treated simultaneously. However, the electric furnace has difficulty in achieving delicate heating control and thus has difficulty in providing the same heating condition for all the glass substrates that are treated simultaneously. Further, since it takes time to reach a predetermined heating temperature and to return to room temperature from the predetermined heating temperature in the electric furnace, there is a problem that if single-wafer processing is applied, the throughput degrades significantly.

Therefore, the present inventors attempted to carry out, using the optical heating apparatus, single-wafer processing of a glass substrate having a phase shift film in which the thickness on its outer peripheral side (outer peripheral portion) was made greater than that on its center side (outer peripheral portion) so that the in-plane transmittance uniformity was adjusted in a predetermined allowable range. An optical heat treatment ought to have been capable of uniformly heating a surface to be treated, but as a result of measuring the optical properties of the phase shift film after the optical heat treatment, the in-plane transmittance uniformity and the in-plane phase difference uniformity exceeded the predetermined allowable ranges.

It had been desired that even if the optical heat treatment was applied to the glass substrate having the phase shift film, the transmittance distribution and the phase difference distribution should be in the predetermined allowable ranges.

Incidentally, in the case where a heat treatment was carried out, using the vertical electric furnace, for a glass substrate having a phase shift film in which the thickness on its outer peripheral side (outer peripheral portion) was made greater than that on its center side (central portion) so that the in-plane transmittance uniformity was adjusted in the predetermined allowable range, the in-plane transmittance uniformity and the in-plane phase difference uniformity were degraded compared to the case where the heat treatment was carried out using the optical heating apparatus, resulting in that the in-plane transmittance uniformity and the in-plane phase difference uniformity exceeded the predetermined allowable ranges.

Means for Solving the Problem

As a result of intensive studies in order to solve the above-mentioned technical problems, the following has been clarified.

A phase shift film formed by sputtering under the above-mentioned condition, that is, using the sputtering apparatus of the so-called oblique-incidence sputtering type wherein a reactive gas such as oxygen or nitrogen is supplied from the lateral side or the lower side of a transparent substrate and most of the reactive gas is caused to flow in a space relatively close to the transparent substrate, should be such that the thickness of such a phase shift film is relatively large on the outer peripheral side (outer peripheral portion) of a main surface compared to that on the center side (central portion) thereof. By this, the difference in transmittance and the difference in phase difference can be made small between the phase shift film on the outer peripheral side where the content of oxygen or nitrogen is relatively high and the phase shift film on the center side where the content of oxygen or nitrogen is relatively low, so that a relatively balanced state is achieved (the relatively balanced state is achieved by the thickness ratio between Ho and Hc in FIG. 1). When a heat treatment (e.g. at 400° C. for 1 hour) is applied to the phase shift film, oxygen in the atmosphere is taken into a surface layer of the phase shift film to change the film composition of the surface layer so that an oxide layer is formed as the surface layer. It is considered that the oxide layer of the surface layer is substantially formed of $SiO_2$ or a composition close to it. In this event, regardless of whether the film composition of the surface layer of the phase shift film before the heat treatment is, for example, MoSiN, MoSiON, MoSiO, or MoSi or whether the content of N or O in such a surface layer is high or low, the film composition of the surface layer of the phase shift film after the heat treatment is considered to be substantially formed of $SiO_2$ or a composition close to it. It is considered that even if the content of an element, other than an element derived from a target, in the surface layer of the phase shift film before the heat treatment differs in the plane, the surface layer with the composition close to $SiO_2$ of the phase shift film after the heat treatment becomes substantially the same (hardly affected by the film composition of the surface layer of the phase shift film before the heat treatment).

In general, when the oxygen content of a phase shift film increases, the transmittance tends to increase while the phase difference tends to decrease. When a heat treatment such as an optical heat treatment is applied to a phase shift film under an in-plane uniform condition (condition in which the in-plane uniformity of the cumulative irradiation dose is high), oxygen is taken into a surface layer of the phase shift film in a substantially uniform distribution in a thickness direction from a surface of the phase shift film in the plane. When the oxygen content of the surface layer changes in the uniform thickness distribution (an oxide layer with a uniform thickness is formed as the surface layer) on the outer peripheral side (outer peripheral portion) and the center side (central portion), having different thicknesses, of the phase shift film in the state where the transmittance and the phase difference are relatively balanced in the plane and thus are substantially uniform in the plane, an increased amount of the transmittance of the phase shift film on its center side (central portion) becomes greater than that of the transmittance of the phase shift film on its outer peripheral side (outer peripheral portion). On the other hand, a decreased amount of the phase difference of the phase shift film on its center side (central portion) becomes smaller than that of the phase difference of the phase shift film on its outer peripheral side (outer peripheral portion). It is conjectured that, for this reason, the in-plane transmittance uniformity and the in-plane phase difference uniformity were reduced in the phase shift film after carrying out the optical heat treatment. This can be understood from the fact that, in FIG. 2, an influence (an increased transmittance amount, a decreased phase difference amount) by the formation of an oxide layer (substantially uniform composition) with a uniform thickness h in a state of Ho>Hc is greater at smaller thickness Hc than at greater thickness Ho (with respect to Hc' and Ho' substantially contributing to the transmittance, the ratio (rate) (Hc'/Hc) at which the thickness on the center side (central portion) decreases is relatively large compared to the ratio (rate) (Ho'/Ho) at which the thickness on the outer peripheral side (outer peripheral portion) decreases).

As a result of intensive studies based on the results described above, the present inventors have reached an idea that the in-plane transmittance uniformity and the in-plane phase difference uniformity in a phase shift film after an optical heat treatment can be maintained in predetermined allowable ranges by setting an irradiation condition in the optical heat treatment such that the total irradiation dose (cumulative irradiation dose) of light is higher on the outer peripheral side (outer peripheral portion) than on the center side (central portion), and have completed this invention (invention A).

This invention includes an invention (invention B) which relates to the invention (invention A), wherein in the case where the in-plane transmittance uniformity and the in-plane phase difference uniformity exceed predetermined allowable ranges after carrying out a heat treatment with high in-plane uniformity (heat treatment in which the in-plane uniformity of the cumulative irradiation dose is high) using the optical heating apparatus while the in-plane transmittance uniformity and the in-plane phase difference uniformity before the heat treatment are in the predetermined allowable ranges, heating conditions at respective in-plane portions are controlled (controlling to heating conditions different from the heating condition with high in-plane uniformity) using the optical heating apparatus so that the in-plane transmittance uniformity and the in-plane phase difference uniformity can be maintained in the predetermined allowable ranges even after carrying out a heat treatment, for example, the cumulative irradiation doses at the in-plane portions are controlled. That is, there is included an invention which, by controlling heating conditions at respective in-plane portions (controlling to heating conditions different from the heating condition with high in-plane uniformity) using the optical heating apparatus, for example, by controlling the cumulative irradiation doses at the in-plane portions, controls the thicknesses of an oxide layer at the in-plane portions to be substantially different from each other, thereby controlling the in-plane transmittance uniformity and the in-plane phase difference uniformity to be in the predetermined allowable ranges after carrying out a heat treatment.

The invention B described above is free of the limitations of the oblique-incidence sputtering type, the reactive gas lateral or from-below supply method (in-plane composition is non-uniform), and the irradiation condition in which the total irradiation dose (cumulative irradiation dose) of light is higher at the outer peripheral portion than at the central portion.

This invention includes an invention (invention C) which relates to the invention (invention A), wherein, compared to the aspect of the invention (invention A) in which, taking into account that when the in-plane composition is non-uniform and "when the thickness of an outer peripheral portion is relatively large compared to that of a central portion, if a heat treatment such as an optical heat treatment is carried out under an in-plane uniform condition (condition in which the in-plane uniformity of the cumulative irradiation dose is high), an increased amount of the transmittance of a phase shift film at its central portion becomes greater than that of the transmittance of the phase shift film at its outer peripheral portion", a thin film is formed thicker at its substrate outer peripheral portion than at its central portion so that the in-plane transmittance uniformity is in a predetermined allowable range before a heat treatment (at the stage of the film formation) while the in-plane composition is non-uniform, an outer peripheral portion is formed relatively thin (e.g. although it is the same as the invention A in that the thickness of the outer peripheral portion is made greater than that on the center side, the outer peripheral portion is formed relatively thin compared to the outer peripheral portion of the invention A so that it is possible to avoid carrying out additional oxidation of the outer peripheral portion or to make small the amount of additional oxidation of the outer peripheral portion in a later heat treatment step) and heating is carried out using the optical heating apparatus under a condition in which the in-plane uniformity is high (condition in which the in-plane uniformity of the cumulative irradiation dose is high) or heating is carried out using the optical heating apparatus under an irradiation condition in which the total irradiation dose of light is higher at the outer peripheral portion than at the central portion as in the invention A while the difference between the total irradiation doses in the plane is smaller than that in the invention A, thereby controlling the in-plane transmittance uniformity and the in-plane phase difference uniformity to be in the predetermined allowable ranges after the heat treatment.

The invention (invention C) also includes an invention which, taking into account the difference in heating characteristics in the substrate plane due to the optical heating apparatus, controls the in-plane transmittance distribution and the in-plane phase difference distribution before an optical heat treatment so that the in-plane transmittance uniformity and the in-plane phase difference uniformity are in the predetermined allowable ranges after the optical heat treatment. In addition, there is also included an invention which controls the optical heating condition in the plane.

This invention has the following structures.

(Structure 1)

A mask blank, comprising:

a transparent substrate having a main surface; and a thin film for forming a transfer pattern on the main surface of the transparent substrate;

wherein the thin film is made of a material containing a transition metal and silicon and further containing at least one of oxygen and nitrogen, wherein the thin film has as a surface layer an oxide layer having an oxygen content higher than an oxygen content of the thin film of a region excluding the surface layer, wherein the thin film is formed so that a thickness of an outer peripheral portion is greater than a thickness of a central portion on a side of the main surface, and wherein the oxide layer is formed so that a thickness of the outer peripheral portion is greater than a thickness of the central portion on the side of the main surface.

(Structure 2)

The mask blank according to Structure 1, wherein the thin film is a semitransmissive film having a transmittance of 1% or more for exposure light.

(Structure 3)

The mask blank according to Structure 1, wherein the thin film is a halftone phase shift film having a transmittance of 1% or more for exposure light and adapted to produce a predetermined phase difference between exposure light transmitted through the thin film and exposure light transmitted in air for a distance equal to a thickness of the thin film.

(Structure 4)

The mask blank according to Structure 2 or 3, wherein the thin film is formed so that an in-plane distribution of the transmittance is in a range of 0.6%.

(Structure 5)

The mask blank according to Structure 3, wherein the thin film is formed so that an in-plane distribution of the phase difference is in a range of 4 degrees.

(Structure 6)

A method of manufacturing the mask blank according to any one of Structures 1 to 5, comprising:

a thin film forming step of forming, on the main surface of the transparent substrate, the thin film by sputtering using a target containing the transition metal and the silicon in a sputtering gas containing at least one of the oxygen and the nitrogen; and an optical heat treatment step of carrying out, in a gas containing the oxygen, an optical heat treatment for the thin film formed in the thin film forming step to form the oxide layer as the surface layer of the thin film, wherein the optical heat treatment step controls a cumulative irradiation dose of light irradiated onto the thin film so as to be higher at the outer peripheral portion than at the central portion on the side of the main surface.

(Structure 7)

The method according to Structure 6, wherein the thin film forming step rotates the substrate about a rotation axis passing through a center of the main surface and disposes a sputtering surface of the sputtering target at a position facing the main surface of the substrate and having a predetermined angle with respect to the main surface so that the rotation axis of the substrate and a straight line passing through a center of the sputtering surface and parallel to the rotation axis of the substrate are offset from each other, thereby forming the thin film by the sputtering.

(Structure 8)

The method according to Structure 6 or 7, wherein the optical heat treatment step carries out the optical heat treatment for the thin film using a light irradiator in which a plurality of cylindrical lamps are disposed in a lattice pattern.

(Structure 9)

The method according to Structure 8, wherein the cylindrical lamp is a halogen heater.

(Structure 10)

A transfer mask, comprising:

the transfer pattern formed in the thin film of the mask blank according to any one of Structures 1 to 5.

(Structure 11)

A method of manufacturing a transfer mask, comprising:

a pattern forming step of forming the transfer pattern in the thin film of the mask blank manufactured by the method according to any one of Structures 6 to 9.

Effect of the Invention

According to this invention, it is possible to obtain a mask blank in which the in-plane transmittance uniformity and the in-plane phase difference uniformity are in predetermined allowable ranges after an optical heat treatment.

MODE FOR CARRYING OUT THE INVENTION

Hereinafter, this invention will be described in detail.

As recited in the Structure, 1, a mask blank according to this invention, comprising:

a transparent substrate having a main surface; and a thin film for forming a transfer pattern on the main surface of the transparent substrate;

wherein the thin film is made of a material containing a transition metal and silicon and further containing at least one of oxygen and nitrogen, wherein the thin film has as a surface layer an oxide layer having an oxygen content higher than an oxygen content of the thin film of a region excluding the surface layer, wherein the thin film is formed so that a thickness of an outer peripheral portion is greater than a thickness of a central portion on a side of the main surface, and wherein the oxide layer is formed so that a thickness of the outer peripheral portion is greater than a thickness of the central portion on the side of the main surface.

Figure 2:
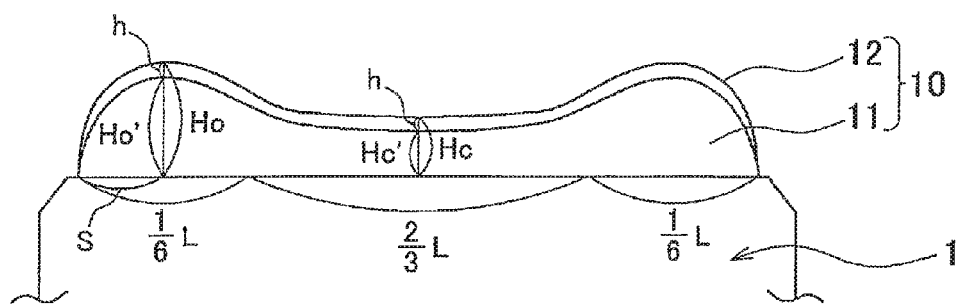
FIG. 2 is an exemplary diagram for explaining an aspect in which a semitransmissive film is formed thicker at its outer peripheral portion than at its central portion to adjust the in-plane transmittance uniformity in a predetermined range and then heating is carried out under a condition with high in-plane uniformity using an optical heating apparatus, thereby forming an oxide layer as a surface layer of the semitransmissive film.

In the invention according to the Structure 1, the thin film has as its surface layer the oxide layer with the oxygen content higher than that of the thin film of the region other than the surface layer. For example, as shown in FIG. 2, a thin film 10 has as its surface layer an oxide layer 12 with an oxygen content higher than that of a thin film 11 of a region other than the surface layer. The oxide layer is formed by a heat treatment (annealing) and does not include an oxide layer which is formed by natural oxidation or use of a mask (long-time irradiation of exposure light) in a time-dependent manner.

In the invention according to the Structure 1, the thin film is formed so that the thickness of its outer peripheral portion is greater than that of its central portion on the main surface side. For example, as shown in FIG. 2, the thin film 10 is formed so that a thickness Ho of its outer peripheral portion is greater than a thickness Hc of its central portion on the main surface side. Specifically, the thin film 10 is substantially flat (i.e. the thickness is constant) at its central portion and increases in thickness toward its outer peripheral portion.

For example, as shown in FIG. 2, assuming that the length of a side of the thin film is given as L, the average value of the thicknesses of a region with (⅔)L in the middle of the substrate can be used as the thickness Hc of the central portion and the average value of the thicknesses of a region with (⅙)L on the outer peripheral side of the substrate can be used as the thickness Ho of the outer peripheral portion. This also applies to the other inventions (Structures).

Alternatively, for example, as shown in FIG. 2, a value measured at the center of the substrate can be used as the thickness Hc of the central portion and a value measured at a position at a predetermined distance S from an end of the thin film (substrate) can be used as the thickness Ho of the outer peripheral portion. This also applies to the other inventions (Structures).

In the thin film 10, the thickness Hc of its central portion and the thickness Ho of its outer peripheral portion are adjusted, for example, before a heat treatment (annealing) so that the in-plane transmittance uniformity can be adjusted in a predetermined range. The ratio between the thickness Hc of the central portion and the thickness Ho of the outer peripheral portion in the thin film 10 is preferably in a range of, for example, Ho/Hc=1.01 to 1.05 although it depends on the relationship with the composition of the thin film, the transmittance of the thin film, the thickness of the thin film, and so on.

In the invention according to the Structure 1, the oxide layer is formed so that the thickness of its outer peripheral portion is greater than that of its central portion on the main surface side. For example, as shown in FIG. 3, the oxide layer 12 is formed so that a thickness h' of its outer peripheral portion is greater than a thickness h of its central portion on the main surface side.

Figure 3:
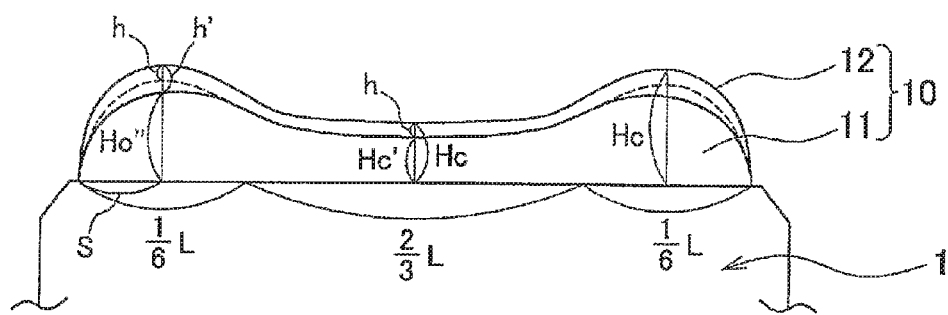
FIG. 3 is an exemplary diagram for explaining an aspect in which a semitransmissive film is formed thicker at its outer peripheral portion than at its central portion to adjust the in-plane transmittance uniformity in a predetermined range and then the cumulative irradiation dose of light irradiated using an optical heating apparatus is controlled to be higher at the outer peripheral portion than at the central portion, thereby forming an oxide layer so that the thickness of its outer peripheral portion is greater than that of its central portion.

For example, as shown in FIG. 3, assuming that the length of a side of the thin film is given as L, the average value of the thicknesses of a region with (⅔)L in the middle of the substrate can be used as the thickness h of the central portion and the average value of the thicknesses of a region with (⅙)L on the outer peripheral side of the substrate can be used as the thickness h' of the outer peripheral portion. This also applies to the other inventions (Structures).

Alternatively, for example, as shown in FIG. 3, a value measured at the center of the substrate can be used as the thickness h of the central portion and a value measured at a position at a predetermined distance S from an end of the thin film (substrate) can be used as the thickness h of the outer peripheral portion. This also applies to the other inventions (Structures).

In order to make the thickness h' of the outer peripheral portion greater than the thickness h of the central portion in the oxide layer 12 on the main surface side, conditions (temperature, time, etc.) of a heat treatment (annealing) are set to be different at the central portion and at the outer peripheral portion. For example, conditions (temperature, time, etc.) of a heat treatment (annealing) of the outer peripheral portion are set to be greater than those of the central portion. More specifically, for example, when an optical heating apparatus is used, conditions (irradiated surface temperature, lamp output, irradiation (lighting) time, cumulative irradiation dose, etc.) of a heat treatment (annealing) of the outer peripheral portion can be set to be greater than those of the central portion.

The ratio (h'/h) between the thickness h' of the outer peripheral portion and the thickness h of the central portion in the oxide layer 12 is preferably about 1.01 to 1.07 although it depends on the relationship with the composition of the thin film, the transmittance of the thin film, the thickness of the thin film, and so on.

In the oxide layer 12, the thickness h of its central portion is preferably about 2.0 nm and the thickness h' of its outer peripheral portion is preferably about 2.1 nm.

In the thin film 11, the ratio between a thickness Hc of its central portion and a thickness Ho" of its outer peripheral portion after the heat treatment is preferably in a range of, for example, Ho"/Hc'=1.01 to 1.05 although it depends on the relationship with the composition of the thin film, the transmittance of the thin film, the thickness of the thin film, and so on.

In this invention, when the oxide layer is formed relatively thick at its outer periphery, the net thin film 11 substantially contributing to the transmittance and the phase difference becomes relatively thin at its outer periphery so that the transmittance increases, which, therefore, can countervail the increase in transmittance at the central portion when the thickness of the oxide layer is uniform.

Figure 1:
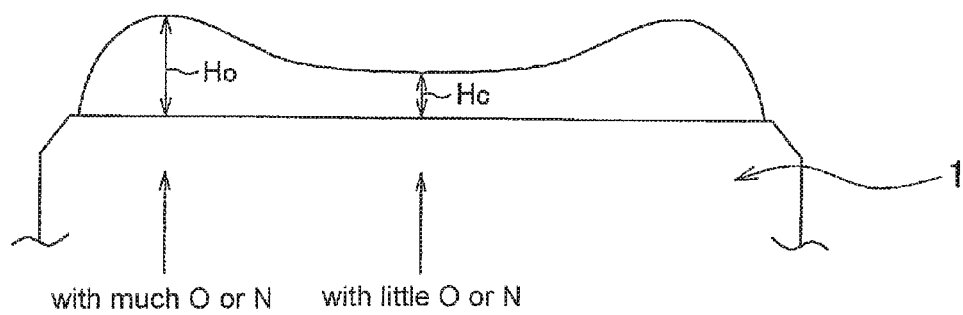
FIG. 1 is an exemplary diagram for explaining an aspect in which a semitransmissive film is formed thicker at its outer peripheral portion than at its central portion, thereby adjusting the in-plane transmittance uniformity in a predetermined range.

In FIGS. 1, 2, and 3, the thin film 10 is formed on a main surface of a transparent substrate 1.

In this invention (Structures 1 to 11), the thin film for transfer pattern formation is made of a material containing a transition metal M and silicon (Si) and further containing at least one of oxygen (O) and nitrogen (N).

In this invention, as the transition metal M, there can be cited one of molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), palladium (Pb), and so on, an alloy thereof, or the like.

In this invention, the thin film for transfer pattern formation may be made of a material containing, in addition to the above-mentioned component, carbon, hydrogen, an inert gas (helium, argon, xenon, or the like), or the like.

In this invention (Structures 1 to 11), more specifically, as the thin film for transfer pattern formation, there can be cited a transition metal silicide, a transition metal silicide nitride, a transition metal silicide oxynitride, a transition metal silicide oxide, a transition metal silicide carbonitride, a transition metal silicide carboxynitride, a transition metal silicide oxycarbide, or the like.

In this invention (Structures 1 to 11), the thin film may have a single-layer structure or a multilayer structure. The thin film may be configured to comprise an antireflection layer. The thin film may be a composition gradient film.

In this invention (Structures 1 to 11), the semitransmissive film may have a single-layer structure, a two-layer structure comprising a low-transmittance layer and a high-transmittance layer, or a multilayer structure.

In this invention (Structures 1 to 11), the semitransmissive film may be of the high-transmittance type. The high-transmittance type has, for example, a relatively high transmittance of 10 to 30% while the transmittance is normally 1% to less than 10%.

In this invention (Structures 1 to 11), the thin film may be a semitransmissive film in a phase shift mask or an enhancer mask or a light-shielding film in a binary mask.

In this invention (Structures 1 to 11), the transition metal is preferably molybdenum.

This is because, as described before, the thin film made of a material such as MoSiN or MoSiON tends to have a relatively large compressive stress and a heat treatment is effective for reducing the compressive stress, and therefore, the subject of this application becomes particularly significant.

In this invention (Structures 1 to 11), as the thin film for transfer pattern formation, there can be cited, for example, molybdenum silicide (MoSi), molybdenum silicide nitride (MoSiN), molybdenum silicide oxynitride (MoSiNO), molybdenum silicide oxide (MoSiO), molybdenum silicide carbonitride (MoSiCN), molybdenum silicide oxycarbide (MoSiOC), molybdenum silicide carboxynitride (MoSiOCN), or the like.

In this invention (Structures 1 to 11), the thin film may be any thin film of a transition metal silicide-based material (Structure 1). For example, the thin film may be a light-shielding film of a binary mask. Even in the light-shielding film of the binary mask, the phase difference is required to be reduced in terms of EMF bias and, for example, in the case where the in-plane phase difference distribution is strictly questioned, the invention of this application can be effectively applied thereto.

In this invention (Structures 1 to 11), as the thin film, there can be cited, for example, a semitransmissive film having a transmittance of 1% or more for exposure light (Structure 2). As such a semitransmissive film, there can be cited, for example, a semitransmissive film with a phase difference of zero for manufacturing an enhancer mask or a semitransmissive film for manufacturing a phase shift mask which cannot obtain a phase difference large enough to produce a phase shift effect only by the semitransmissive film, but can obtain a phase difference large enough to produce a phase shift effect by digging down a substrate surface of a light-transmissive portion to a predetermined depth.

In this invention (Structures 1 to 11), as the thin film, there can be cited a halftone phase shift film having a transmittance of 1% or more for exposure light and adapted to obtain a predetermined phase difference, that produces a phase shift effect, between exposure light transmitted through the thin film and exposure light transmitted in air for a distance equal to the thickness of the thin film (Structure 3).

In this invention (Structures 1 to 11), when the thin film is a light-shielding film of a binary mask, its thickness is preferably 65 nm or less and more preferably 55 nm or less.

When the thin film is a halftone phase shift film of a halftone phase shift mask, its thickness is preferably 75 nm or less and more preferably 70 nm or less. When the thin film is a semitransmissive film of an enhancer mask, its thickness is preferably 40 nm or less and more preferably 30 nm or less.

In this invention (Structures 1 to 11), the thickness of the oxide layer is preferably 1.0 to 3.5 nm and more preferably 1.5 to 2.5 nm. When the thickness of the oxide layer is in this range, it is possible to distinguish from an oxide layer which is formed by natural oxidation or use of a mask (long-time irradiation of exposure light) in a time-dependent manner.

In this invention (Structures 1 to 11), the thin film is preferably such that the in-plane transmittance distribution is in a range of 0.6% (Structure 4). For example, when the transmittances of in-plane portions relative to a target transmittance value are in a range of +0.6% or in a range of −0.6% or when maximum and minimum transmittance values of in-plane portions relative to a target transmittance value are in a range of ±0.3%, the in-plane transmittance distribution is in a range of 0.6%.

In this invention (Structures 1 to 11), the thin film is more preferably such that the transmittances (maximum and minimum transmittance values) of in-plane portions relative to a target transmittance value are in a range of ±0.3%.

In this invention (Structures 1 to 11), when the in-plane transmittance uniformity is in a predetermined allowable range, it is preferable that the transmittances (maximum and minimum transmittance values) of in-plane portions relative to a target transmittance value be in a range of ±0.3%.

In this invention (Structures 1 to 11), the thin film is preferably such that the in-plane phase difference distribution is in a range of 4 degrees (Structure 5). For example, when the phase differences of in-plane portions relative to a target phase difference value are in a range of +4 degrees or in a range of −4 degrees or when maximum and minimum phase difference values of in-plane portions relative to a target phase difference value are in a range of ±2 degrees, the in-plane phase difference distribution is in a range of 4 degrees.

In this invention (Structures 1 to 11), the thin film is more preferably such that the phase differences (maximum and minimum phase difference values) of in-plane portions relative to a target phase difference value are in a range of ±2 degrees.

In this invention (Structures 1 to 11), when the in-plane phase difference uniformity is in a predetermined allowable range, it is preferable that the phase differences (maximum and minimum phase difference values) of in-plane portions relative to a target phase difference value be in a range of ±2 degrees.

A method of manufacturing the mask blank according to this invention recited in any one of the Structures 1 to 5, comprising:

a thin film forming step of forming, on the main surface of the transparent substrate, the thin film by sputtering using a target containing the transition metal and the silicon in a sputtering gas containing at least one of the oxygen and the nitrogen; and an optical heat treatment step of carrying out, in a gas containing the oxygen, an optical heat treatment for the thin film formed in the thin film forming step to form the oxide layer as the surface layer of the thin film, wherein the optical heat treatment step controls a cumulative irradiation dose of light irradiated onto the thin film so as to be higher at the outer peripheral portion than at the central portion on the side of the main surface (the Structure 6).

This invention includes an invention which relates to the invention according to the Structure 6, wherein in the case where the in-plane transmittance uniformity and the in-plane phase difference uniformity exceed predetermined allowable ranges after carrying out a heat treatment with high in-plane uniformity (heat treatment in which the in-plane uniformity of the cumulative irradiation dose is high) using the optical heating apparatus while the in-plane transmittance uniformity and the in-plane phase difference uniformity before the heat treatment are in the predetermined allowable ranges, heating conditions at respective in-plane portions are controlled (controlling to heating conditions different from the heating condition with high in-plane uniformity) using the optical heating apparatus so that the in-plane transmittance uniformity and the in-plane phase difference uniformity can be maintained in the predetermined allowable ranges even after carrying out a heat treatment, for example, conditions (irradiated surface temperature, lamp output, irradiation (lighting) time, cumulative irradiation dose, etc.) of a heat treatment (annealing) at the in-plane portions are controlled.

The invention described above is free of the limitations of the oblique-incidence sputtering type, the lateral or from-below supply method (in-plane composition is non-uniform), and the irradiation condition in which the total irradiation dose (cumulative irradiation dose) of light is higher at the outer peripheral portion than at the central portion.

In the optical heat treatment step, as a method of controlling the cumulative irradiation dose of light irradiated onto the thin film to be higher at its outer peripheral portion than at its central portion on the main surface side, there can be cited a method of controlling by providing different cumulative light irradiation times in the plane, a method of controlling by providing different light intensities in the plane (thus different temperatures at irradiated portions in the plane), a method combining them, or the like.

In the method of controlling by providing different light intensities in the plane (thus different temperatures at irradiated portions in the plane), since the heat of the irradiated portions is transferred to the surroundings, the temperature control of the irradiated portions should be carried out to a high degree of accuracy.

In this invention, "controlling to heating conditions different from the heating condition with high in-plane uniformity" is achieved, for example, by using a light irradiator in which a plurality of cylindrical lamp tubes are disposed in a lattice pattern and causing the outputs of the lamps disposed along four sides at the outer peripheral edge to be relatively high, or alternatively, by uniformly heating the thin film (forming an oxide layer with a uniform thickness in the plane) using an optical heating apparatus (e.g. a light irradiator in which a plurality of cylindrical lamp tubes are disposed in a lattice pattern) having a flat heating surface with an area greater than that of the substrate, then, in addition, further heating (additionally heating) the outer periphery (increasing the thickness of the oxide layer at its outer periphery additionally). The further heating (additional heating) of the outer periphery can be achieved, for example, by using a light irradiator in which a plurality of cylindrical lamp tubes are disposed in a lattice pattern and turning on the lamps disposed along four sides at the outer peripheral edge (disposed near the four sides) (e.g. the second lamp from the right and the second lamp from the left in FIG. 5) while turning off the other lamps including the lamps on the center side (e.g. the lamps other than the second lamp from the right and the second lamp from the left in FIG. 5).

In this invention, "heating condition with high in-plane uniformity" includes an aspect in which, for example, the outputs of the lamps disposed along four sides at the outer peripheral edge (disposed near the four sides) are increased.

In this invention (Structures 1 to 11), preferably, the thin film forming step rotates the substrate about a rotation axis passing through the center of the main surface and disposes a sputtering surface of the sputtering target at a position facing the main surface of the substrate and having a predetermined angle with respect to the main surface so that the rotation axis of the substrate and a straight line passing through the center of the sputtering surface and parallel to the rotation axis of the substrate are offset from each other, thereby forming the thin film by sputtering (Structure 7).

With this structure (so-called oblique-incidence sputtering), it is possible to prevent the thickness of the film at the central portion of the substrate from becoming relatively large and further to reduce defects due to particles.

Figure 4:
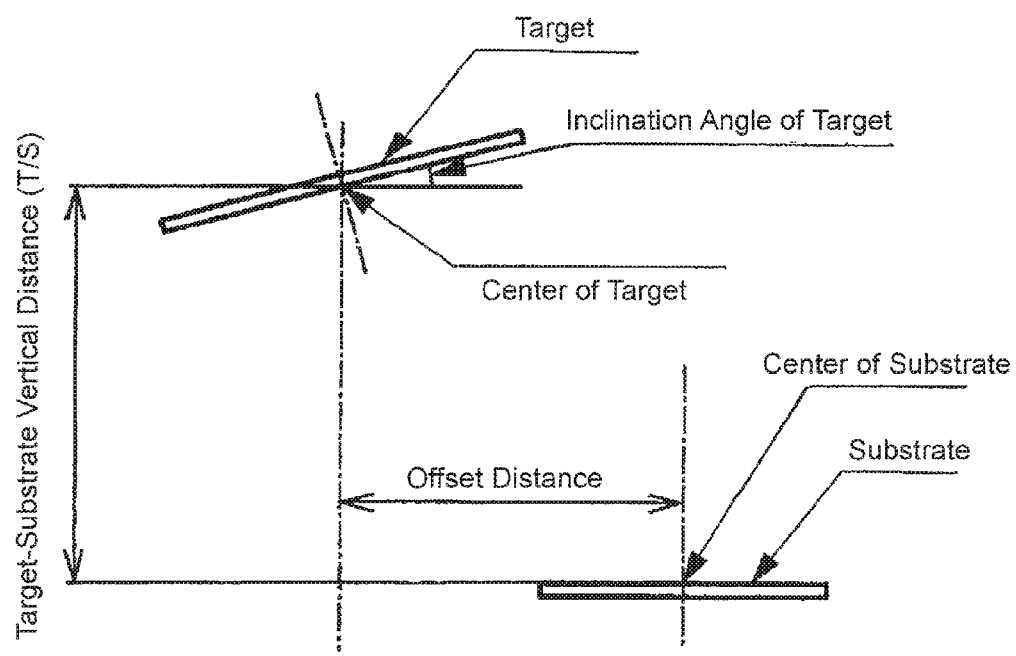
FIG. 4 is an exemplary diagram showing one example of a sputtering apparatus.

In this invention (Structures 1 to 11), preferably, for example, as shown in FIG. 4, the thin film forming step rotates the substrate about a rotation axis passing through the center of the main surface and disposes a sputtering surface of a sputtering target at a position facing the main surface of the substrate and having a predetermined angle with respect to the main surface so that the rotation axis of the substrate and a straight line passing through the center of the sputtering surface and parallel to the rotation axis of the substrate are offset from each other (offset distance), thereby forming the thin film by sputtering.

In this invention (Structures 1 to 11), the thin film forming step preferably uses a single-wafer film forming apparatus. This is because the subject of this invention becomes particularly significant when a high-precision single-wafer film forming apparatus is used. Compared to a non-single-wafer film forming apparatus, the single-wafer film forming apparatus enables high-precision film formation with high in-plane thickness uniformity and high in-plane optical property uniformity. Further, the single-wafer film forming apparatus can reduce various variations between blanks (substrates) compared to the non-single-wafer film forming apparatus.

In this invention (Structures 1 to 11), preferably, the thin film forming step is carried out while rotating the substrate. This is for forming the thin film to be uniform in thickness and so on compared to a case where the substrate is not rotated.

In this invention (Structures 1 to 11), DC sputtering is preferable in the thin film forming step. This is because its film forming rate is high and thus it is excellent in productivity.

In this invention (Structures 1 to 11), the optical heat treatment step can be carried out using an optical heating apparatus.

In this invention, the optical heat treatment step carries out the treatment preferably under an irradiation condition of heating the thin film to 200° C. or more, more preferably under an irradiation condition of heating the thin film to 300° C. or more, and further preferably under an irradiation condition of heating the thin film to 400° C. or more. On the other hand, the optical heat treatment step carries out the treatment preferably under an irradiation condition of heating the thin film to 1000° C. or less and more preferably under an irradiation condition of heating the thin film to 800° C. or less.

In this invention (Structures 1 to 11), as a heater for use in the optical heat treatment step, there can be cited a halogen heater, a ceramic heater, a quartz tube heater, or the like.

The halogen heater is a heater which uses, as heat, light emitted from a halogen lamp. The halogen heater has a structure in which, for example, filaments such as tungsten filaments are disposed continuously or intermittently (the filaments are electrically connected to each other) in a cylindrical quartz tube from its one end to the other end and both ends of the quartz tube are sealed.

The halogen heater is preferably such that, for example, the time required for increasing the temperature of a mask blank surface from an ordinary temperature to 800° C. is about 20 seconds while the time required for reducing the temperature of the mask blank surface from 400° C. to 150° C. is about 2 minutes.

In this invention, it is preferable that the optical heat treatment step carries out the optical heat treatment for the thin film using a light irradiator in which a plurality of cylindrical lamps are disposed in a lattice pattern (the Structure 8).

In this invention, it is preferable that the cylindrical lamp is a halogen heater (the Structure 9).

In this invention (Structures 1 to 11), the optical heat treatment is preferably a treatment of irradiating light emitted from the halogen heaters onto the transparent substrate (mask blank) having the thin film. In the wavelength spectrum of light emitted from the halogen heater, the intensity of light in the infrared region is particularly high compared to those of light in the other wavelength regions. Since the thin film is formed to a thickness that provides a predetermined transmittance for light with a short wavelength of about 193 nm, the thin film exhibits a relatively high transmittance for light with a wavelength in the infrared region. The light emitted from the halogen heater is polychromatic light comprising a plurality of wavelengths. In the light emitted from the halogen heater, light with a wavelength in the infrared region passes through the thin film at a relatively high transmittance and reaches the transparent substrate (glass substrate). The transparent substrate (glass substrate) containing OH groups, water, and so on has prominent absorption bands at wavelengths of 1.38 μm, 2.22 μm, and 2.72 μm. Accordingly, the light emitted from the halogen heater preferably has sufficiently high intensities at the wavelengths of 1.38 μm, 2.22 μm, and 2.72 μm. Further, taking this condition into account, the halogen heater for use in the optical heat treatment preferably has a color temperature of 2200K or more and 3400K or less.

Figure 5:
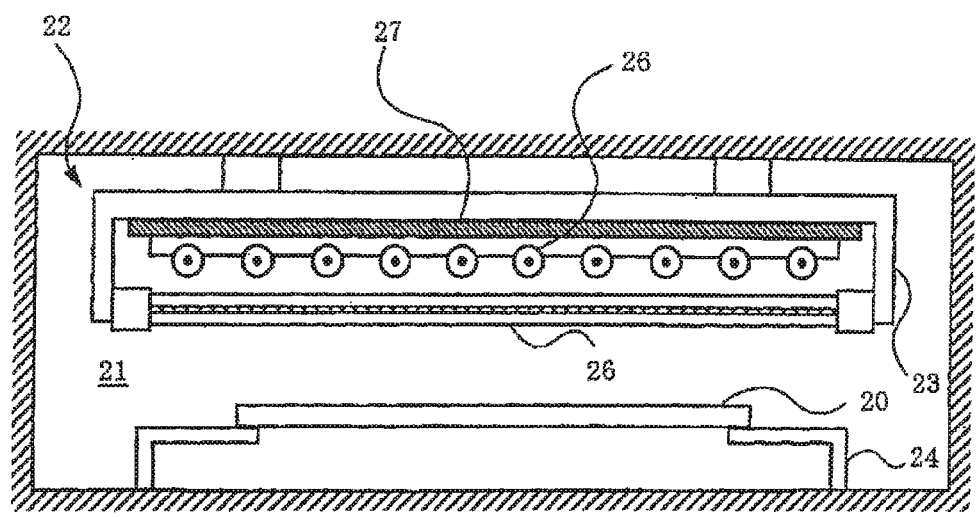
FIG. 5 is an exemplary cross-sectional view showing one example of an optical heating apparatus.

In this optical heat treatment, an optical heating apparatus shown in FIG. 5 can be used. This optical heating apparatus has a main structure in which a light source unit 22 and a stage 24 for placing a mask blank (substrate) 20 thereon are provided in a process chamber 21. A thin film for transfer pattern formation (not illustrated) is formed on an upper surface (surface on the light source unit 22 side) of the mask blank 20 shown in FIG. 5. The light source unit 22 may be configured such that a plurality of cylindrical halogen heaters 26 are disposed parallel to each other in upper and lower two tiers in a unit frame 23. The upper-tier and lower-tier halogen heaters 26 may be arranged in a lattice pattern in plan view. With the light source unit 22 thus configured, light in the infrared region can be substantially uniformly irradiated onto the main surface of the mask blank (substrate) 20. As an optical heating apparatus, it is possible to use an apparatus of a structure in which halogen heaters are used instead of the incandescent lamps in the optical heating apparatus described in Patent Literature 3. In this event, there is included an aspect in which filaments are disposed so as to avoid heating at crossing portions between the halogen heaters disposed in a lattice pattern.

A reflective plate 27 may be provided on a surface of the unit frame 23 on the upper side of the upper-tier halogen heaters 26. By this, light in the infrared region emitted upward from the halogen heaters 26 can be reflected by the reflective plate 27 and irradiated onto the main surface of the mask blank (substrate) 20. The stage 24 may have a shape with an opening so as to hold the outer peripheral edge of the mask blank (substrate) 20. A light source unit (not illustrated) having the same structure as the light source unit 22 may also be provided under the opening.

An aspect in which an optical heat treatment of the mask blank (substrate) 20 is carried out in a gas containing oxygen in the optical heating apparatus includes an aspect in which oxygen contained in the atmosphere is used at an ordinary pressure (in the atmosphere) or at a reduced pressure (e.g. 1.0 to $1.0 \times 10^5$ Pa), and further includes an aspect in which a heat treatment is carried out in an atmosphere with a high oxygen ($O_2$) concentration by supplying an oxygen gas ($O_2$) at an ordinary pressure (in the atmosphere) or at a reduced pressure (e.g. 1.0 to $1.0 \times 10^5$ Pa).

A transfer mask according to this invention, comprising: the transfer pattern formed in the thin film of the mask blank according to any one of Structures 1 to 5 (Structure 10).

A method of manufacturing a transfer mask according to this invention, comprising: a pattern forming step of forming the transfer pattern in the thin film of the mask blank manufactured by the method according to any one of Structures 6 to 9 (Structure 11).

In this invention, a sputtering deposition method, for example, is preferably cited as a method of forming the thin film for transfer pattern formation or the semitransmissive film, but this invention is not limited to the sputtering deposition method.

A DC magnetron sputtering apparatus is preferably cited as a sputtering apparatus, but this invention is not limited to this film forming apparatus. Another type of sputtering apparatus such as an RF magnetron sputtering apparatus may alternatively be used.

In this invention, a resist is preferably a chemically amplified resist. This is because it is suitable for high-accuracy processing.

In this invention, a resist is preferably a resist for electron beam writing. This is because it is suitable for high-accuracy processing.

This invention is applied to a mask blank for electron beam writing which is formed with a resist pattern by electron beam writing.

In this invention, the transparent substrate is not particularly limited as long as it has transparency at an exposure wavelength to be used. In this invention, it is possible to use a quartz substrate or any of various other glass substrates (e.g. $CaF_2$ substrate, soda-lime glass, alkali-free glass substrate, aluminosilicate glass, etc.). Among them, the quartz substrate is particularly suitable for this invention because it has high transparency in the wavelength region of ArF excimer laser.

In this invention, the transfer mask may be a phase shift mask or a binary mask which does not use a phase shift effect. The transfer mask may be a reticle.

The phase shift mask may be a phase shift mask of the halftone type (tritone type) or the like, or an enhancer mask.

In this invention, in addition to the semitransmissive film and its pattern, it is possible to form another thin film and its pattern.

For example, in the case of a structure having a light-shielding film above or below the semitransmissive film, since the material of the semitransmissive film contains a transition metal silicide, the material of the light-shielding film may be made of chromium having etching selectivity (etching resistance) to the semitransmissive film or a chromium compound in which an element such as oxygen, nitrogen, or carbon is added to chromium. By this, it is possible to form a light-shielding film pattern above or below a semitransmissive film pattern.

In this invention, the material containing chromium may be chromium (Cr) alone or a material containing chromium (Cr) and one or more elements such as nitrogen (N), oxygen (O), carbon (C), hydrogen (H), and helium (He). For example, it may be Cr, CrN, CrO, CrNO, CrNC, CrCON, or the like, or a material containing hydrogen (H) or helium (He) in addition thereto.

In this invention, it is possible to use, for example, a fluorine-based gas, such as $SF_6$, $CF_4$, $C_2F_6$, or $CHF_3$, or a mixed gas of such a fluorine-based gas and He, $H_2$, $N_2$, Ar, $C_2H_4$, $O_2$, or the like for dry-etching the thin film containing a transition metal and silicon.

In this invention, it is possible to use a dry etching gas in the form of a mixed gas containing a chlorine-based gas and an oxygen gas for dry-etching the chromium-based thin film.

In this invention, as the chlorine-based gas for use in dry etching, there can be cited, for example, $Cl_2$, $SiCl_4$, HCl, $CCl_4$, $CHCl_3$, or the like.

In the meantime, in the mask blank of this invention, the thin film for transfer pattern formation provided on the transparent substrate is made of a material containing a transition metal and silicon and further containing at least one of oxygen and nitrogen. On the other hand, even if a material composed of silicon and nitrogen or a material containing a material composed of silicon and nitrogen and one or more elements selected from semi-metal elements, non-metal elements, and a rare gas is used as a material forming a thin film for transfer pattern formation of this invention, the structure of the thin film for transfer pattern formation of this invention can be applied thereto and the same effect can be obtained.

A specific structure is a mask blank comprising a thin film for transfer pattern formation on a main surface of a transparent substrate, wherein the thin film is made of a material composed of silicon and nitrogen or a material containing a material composed of silicon and nitrogen and one or more elements selected from semi-metal elements, non-metal elements, and a rare gas, wherein the thin film has as its surface layer an oxide layer with an oxygen content higher than that of the thin film of a region other than the surface layer, wherein the thin film is formed so that the thickness of its outer peripheral portion is greater than that of its central portion on the main surface side, and wherein the oxide layer is formed so that the thickness of its outer peripheral portion is greater than that of its central portion on the main surface side.

Even in the case of the thin film for transfer pattern formation to which the material composed of silicon and nitrogen, or the like is applied, although not so much as in the case of the thin film for transfer pattern formation of this invention containing the transition metal which is an element with a high refractive index and a high extinction coefficient, when the thin film is formed by sputtering using a sputtering apparatus of the oblique-incidence sputtering type wherein a reactive gas such as oxygen or nitrogen is supplied from the lateral side or the lower side of the transparent substrate and most of the reactive gas is caused to flow in a space relatively close to the transparent substrate, the difference in transmittance and the difference in phase shift amount tend to be large in the thin film between its outer peripheral side where the content of oxygen or nitrogen is relatively high and its center side where the content of oxygen or nitrogen is relatively low. Therefore, even in the case of the thin film for transfer pattern formation to which the material composed of silicon and nitrogen, or the like is applied, it is possible to enhance the transmittance distribution uniformity and the phase shift amount distribution uniformity of the entire thin film by setting the thicknesses of the thin film and the oxide layer as defined in this invention.

Likewise, even in the case where, in the mask blank manufacturing method of this invention, the thin film forming step is replaced with a step of forming a thin film by sputtering using a silicon target or a target made of a material containing silicon and one or more elements selected from semi-metal elements and non-metal elements in a sputtering gas containing a nitrogen-based gas and a rare gas, it is possible to obtain the same effect as that obtained by the mask blank manufacturing method of this invention.

A specific structure is a method of manufacturing a mask blank comprising a thin film for transfer pattern formation on a main surface of a transparent substrate, comprising a thin film forming step of forming, on the main surface of the transparent substrate, the thin film by sputtering using a silicon target or a target made of a material containing silicon and one or more elements selected from semi-metal elements and non-metal elements in a sputtering gas containing a nitrogen-based gas and a rare gas, and an optical heat treatment step of carrying out, in a gas containing oxygen, an optical heat treatment for the thin film formed in the thin film forming step to form an oxide layer as a surface layer of the thin film, wherein the optical heat treatment step controls the cumulative irradiation dose of light irradiated onto the thin film to be higher at its outer peripheral portion than at its central portion on the main surface side.

The semi-metal element to be contained in the thin film is not particularly limited. If, among the semi-metal elements, one or more elements selected from boron, germanium, antimony, and tellurium are to be contained, the selected semi-metal element/elements can be contained in silicon for use as the sputtering target so that the conductivity of the target can be expected to be enhanced, which is thus preferable. Any sputtering method can be applied to the thin film forming step in this mask blank manufacturing method. Since the conductivity of the target is lower than that in the case of the thin film containing the transition metal, it is preferable to use RF sputtering or ion-beam sputtering.

Any non-metal element may be contained in the thin film. Among the non-metal elements, one or more elements selected from carbon, fluorine, and hydrogen are preferably contained. As the nitrogen-based gas used in the thin film forming step, any gas can be used as long as it is a gas containing nitrogen. Since the oxygen content of the thin film before the formation of the oxide layer is preferably suppressed to be low, it is preferable to use a nitrogen-based gas containing no oxygen and more preferable to use a nitrogen gas. As the rare gas used in the thin film forming step, any rare gas can be used. However, in terms of the film forming rate, it is preferable to use argon, krypton, or xenon. On the other hand, in terms of reducing the stress of the thin film to be formed, it is preferable to use helium or neon having a small atomic weight and to positively allow it to be taken into the thin film.

The other structures of the mask blank having the thin film made of the material containing no transition metal and the method of manufacturing such a mask blank are the same as those of the mask blank of this invention and the mask blank manufacturing method of this invention. Further, a transfer mask which is manufactured using the mask blank having the thin film made of the material containing no transition metal and a method of manufacturing such a transfer mask are also the same as the transfer mask of this invention and the transfer mask manufacturing method of this invention.

EXAMPLE

Hereinafter, this invention will be described in further detail with reference to an Example.

Example 1, Comparative Examples 1 and 2

In this Example and Comparative Examples, use was made of a DC sputtering apparatus of the so-called oblique-incidence sputtering type and single-wafer processing type shown in FIG. 4. This apparatus is of the type (not illustrated) in which a reactive gas such as oxygen or nitrogen is supplied from the lateral side of a transparent substrate and the reactive gas is caused to flow only in a space relatively close to the transparent substrate. The substrate was rotated.

Using a synthetic quartz glass substrate having a main surface of a square shape of 6 inches×6 inches with a thickness of 0.25 inches as a transparent substrate, a semi-transmissive film made of molybdenum, silicon, and nitrogen was formed on the transparent substrate.

Specifically, using a mixed target of molybdenum (Mo) and silicon (Si) (Mo:Si=4 mol %:96 mol %), reactive sputtering (DC sputtering) was carried out in a mixed gas atmosphere of argon (Ar), nitrogen ($N_2$), and helium (He), thereby forming a MoSiN film (phase shift film) made of molybdenum, silicon, and nitrogen.

This MoSiN film (phase shift film) had a transmittance of 4.5% and a phase difference of 174.4 degrees at the wavelength 93 nm) of ArF excimer laser.

As a result of XPS (X-ray photoelectron spectroscopy) analysis of a central portion of this MoSiN film (MoSiN film formed at the center of the substrate main surface), the composition of the MoSiN film was Mo:3.2 at %, Si:44.4 at %, and N:51.6 at % at the central portion. Likewise, an outer peripheral portion of the MoSiN film was also analyzed by XPS (X-ray photoelectron spectroscopy). As a result, it was confirmed that the nitrogen content of the outer peripheral portion was higher than that of the central portion by about 3 at %. Measurement regions of the central portion and the outer peripheral portion were the same as the following measurement regions.

According to a film forming condition 1, the film formation was carried out under a condition so that the thickness of the phase shift film was made greater at its outer peripheral portion than at its central portion, thereby adjusting the in-plane transmittance uniformity in a predetermined range (±0.3% relative to the average in-plane transmittance). Under this film forming condition 1, the thickness of the central portion was set to 627 Å and the thickness of the outer peripheral portion was set to 642 Å. As shown in FIG. 2, assuming that the length of a side of the thin film is given as L, the average value of the thicknesses of a region with (⅔)L in the middle of the substrate was used as the thickness Hc of the central portion and the average value of the thicknesses of a region with (⅙)L on the outer peripheral side of the substrate was used as the thickness Ho' of the outer peripheral portion.

On the other hand, according to a film forming condition 2, the film formation was carried out under a normal condition, i.e. under a condition so that the in-plane thickness of the phase shift film was made uniform. Under this film forming condition 2, the thickness of the central portion was 629 Å and the thickness of the outer peripheral portion was 631 Å. Measurement regions of the central portion and the outer peripheral portion were the same as those described above.

For the thin film formed under the film forming condition 1, an optical heat treatment was carried out by single-wafer processing using the optical heating apparatus shown in FIG. 5 under a condition in which the cumulative irradiation doses were controlled to be different from each other in the plane (Example 1). In this optical heat treatment, the lighting time of the halogen heaters (irradiation time for the phase shift film) was set to 7 minutes and the outputs of four halogen heaters located near four sides at the outer peripheral edge of the substrate were set to be relatively high compared to those of the other halogen heaters. By this, the cumulative irradiation dose applied to the phase shift film on its outer peripheral side was made higher than that applied to the phase shift film in its other region including the central portion.

In this manner, by setting the irradiation condition in the optical heat treatment such that the total irradiation dose of light was higher at the outer peripheral portion than at the central portion, the in-plane transmittance uniformity and the in-plane phase difference uniformity in the phase shift film after the optical heat treatment were maintained in predetermined allowable ranges (the transmittance was within ±0.3% relative to a target value of 6.1% and the phase difference was within ±2.0 degrees relative to a target value of 177.0 degrees) (Example 1). After the optical heat treatment in Example 1, the average in-plane transmittance of the phase shift film was 6.14% and the average in-plane phase difference thereof was 177.7 degrees.

In this event, the thickness h of an oxide layer at its central portion was 20 Å and the thickness h of the oxide layer at its outer peripheral portion was 21 Å. As shown in FIG. 3, assuming that the length of a side of the thin film is given as L, the average value of the thicknesses of a region with (⅔)L in the middle of the substrate was used as the thickness h of the central portion and the average value of the thicknesses of a region with (⅙)L on the outer peripheral side of the substrate was used as the thickness h' of the outer peripheral portion.

For the thin film formed under the film forming condition 1, an optical heat treatment was carried out by single-wafer processing using the optical heating apparatus shown in FIG. 5 under a condition in which the in-plane uniformity of the cumulative irradiation dose was high (Comparative Example 1). In this optical heat treatment, the lighting time of the halogen heaters (irradiation time for the phase shift film) was set to 7 minutes and the outputs of all the halogen heaters were set to be equal to each other. By this, the cumulative irradiation dose applied to the phase shift film was substantially uniform in the plane.

In the optical heat treatment under this condition, it is possible to uniformly heat a surface to be treated. Since the phase shift film before the optical heat treatment had high in-plane transmittance uniformity which was in a range of ±0.3% relative to the average in-plane transmittance, the phase shift film after carrying out the optical heat treatment under this condition also ought to have had such high in-plane transmittance uniformity. However, as a result of measuring the optical properties of the phase shift film after the optical heat treatment, the in-plane transmittance uniformity and the in-plane phase difference uniformity exceeded predetermined allowable ranges (the transmittance exceeded a range of ±0.3% relative to a target value of 6.1% and the phase difference exceeded a range of ±2.0 degrees relative to a target value of 177.0 degrees) (Comparative Example 1). In this event, the thickness of an oxide layer was 20 Å both at its central portion and at its outer peripheral portion. Measurement regions of the central portion and the outer peripheral portion were the same as those described above.

For the thin film formed under the film forming condition 2, an optical heat treatment was carried out by single-wafer processing using the optical heating apparatus shown in FIG. 5 under a condition in which the in-plane uniformity of the cumulative irradiation dose was high (Comparative Example 2). In this optical heat treatment, the lighting time of the halogen heaters (irradiation time for the phase shift film) was set to 7 minutes and the outputs of all the halogen heaters were set to be equal to each other. By this, the cumulative irradiation dose applied to the phase shift film was substantially uniform in the plane.

In the optical heat treatment under this condition, it is possible to uniformly heat a surface to be treated. However, the phase shift film before the optical heat treatment exceeded a range of ±0.3% relative to the average in-plane transmittance. As a result of measuring the optical properties of the phase shift film after the optical heat treatment, the in-plane transmittance uniformity and the in-plane phase difference uniformity exceeded predetermined allowable ranges (the transmittance exceeded a range of ±0.3% relative to a target value of 6.1% and the phase difference exceeded a range of ±2.0 degrees relative to a target value of 177.0 degrees) (Comparative Example 2). In this event, the thickness of an oxide layer was 20 Å both at its central portion and at its outer peripheral portion. Measurement regions of the central portion and the outer peripheral portion were the same as those described above.

(Manufacture of Phase Shift Mask)

A light-shielding film made of a material containing chromium was formed on the phase shift film of the phase shift mask blank manufactured in Example 1 described above, thereby manufacturing a phase shift mask blank having the light-shielding film. The formed light-shielding film had a structure in which a CrCON film (thickness 30 nm), a CrN film (thickness 4 nm), and a CrOCN film (thickness 14 nm) were laminated in this order from the phase shift film side. The optical density was 3.1 at the wavelength (193 nm) of ArF excimer laser in the form of the laminated structure of the phase shift film made of MoSiN and the light-shielding film made of the Cr-based materials.

A halftone phase shift mask was manufactured using the manufactured phase shift mask blank having the light-shielding film. Specifically, first, a chemically amplified positive resist film for electron beam writing (PRL009 manufactured by FUJIFILM Electronic Materials Co., Ltd.) was formed as a resist film on the light-shielding film of the mask blank. The resist film was formed by spin coating using a spinner (spin coating apparatus).

Then, using an electron beam writing apparatus, a transfer pattern to be formed in the phase shift film was written on the resist film formed on the mask blank and, thereafter, the resist film was developed with a predetermined developer, thereby forming a resist pattern.

Subsequently, using the resist pattern as a mask, the light-shielding film was etched to form a light-shielding film pattern. A mixed gas of $Cl_2$ and $O_2$ was used as a dry etching gas.

Then, using the resist pattern or the light-shielding film pattern as a mask, the phase shift film was etched to form a phase shift pattern. A mixed gas of $SF_6$ and He was used as a dry etching gas.

Then, the remaining resist pattern was removed and a chemically amplified positive resist film for electron beam writing (PRL009 manufactured by FUJIFILM Electronic Materials Co., Ltd.) was newly formed by spin coating. Further, using an electron beam writing apparatus, a transfer pattern (light-shielding band or the like) to be formed in the light-shielding film was written on the formed resist film and, thereafter, the resist film was developed with a predetermined developer, thereby forming a resist pattern.

Then, using this resist pattern as a mask, the light-shielding film was etched to form a pattern of the light-shielding band or the like. Finally, the remaining resist pattern was removed and a predetermined cleaning treatment was carried out, thereby obtaining a phase shift mask. This phase shift mask had the phase shift pattern with high in-plane transmittance uniformity and high in-plane phase difference uniformity and thus was capable of carrying out exposure transfer with high accuracy.

DESCRIPTION OF SYMBOLS 1 transparent substrate
11 thin film of a region other than a surface layer
12 oxide layer

The invention claimed is:

1. A mask blank, comprising:
a transparent substrate having a main surface; and
a thin film for forming a transfer pattern on the main surface of the transparent substrate;
wherein the thin film is made of a material composed of silicon and nitrogen or a material composed of silicon and nitrogen and one or more elements selected from semi-metal elements, non-metal elements, and rare gases;
wherein the thin film has as a surface layer an oxide layer having an oxygen content higher than an oxygen content of the thin film of a region excluding the surface layer,
wherein the thin film is formed so that a thickness of an outer peripheral portion is greater than a thickness of a central portion on a side of the main surface, and
wherein the oxide layer is formed so that a thickness of the outer peripheral portion is greater than a thickness of the central portion on the side of the main surface.

2. The mask blank according to claim 1, wherein the thin film is a semitransmissive film having a transmittance of 1% or more for exposure light.

3. The mask blank according to claim 1, wherein the thin film is a halftone phase shift film having a transmittance of 1% or more for exposure light and adapted to produce a predetermined phase difference between exposure light transmitted through the thin film and exposure light transmitted in air for a distance equal to a thickness of the thin film.

4. The mask blank according to claim 2, wherein the thin film is formed so that an in-plane distribution of the transmittance is in a range of 0.6%.

5. The mask blank according to claim 3, wherein the thin film is formed so that an in-plane distribution of the transmittance is in a range of 0.6%.

6. The mask blank according to claim 3, wherein the thin film is formed so that an in-plane distribution of the phase difference is in a range of 4 degrees.

7. A transfer mask, comprising:
   the transfer pattern formed in the thin film of the mask blank according to claim 1.

* * * * *